(12) United States Patent
Hartlieb et al.

(10) Patent No.: US 10,766,778 B2
(45) Date of Patent: Sep. 8, 2020

(54) POLYCRYSTALLINE MATERIAL HAVING LOW MECHANICAL STRAIN; METHOD FOR PRODUCING A POLYCRYSTALLINE MATERIAL

(71) Applicant: Robert Bosch GmbH, Stuttgart (DE)

(72) Inventors: Andreas Hartlieb, Stuttgart (DE); Heiko Stahl, Reutlingen (DE); Jochen Beintner, Reutlingen (DE); Juergen Butz, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/992,577

(22) Filed: May 30, 2018

(65) Prior Publication Data

US 2018/0346339 A1    Dec. 6, 2018

(30) Foreign Application Priority Data

May 31, 2017 (DE) .................. 10 2017 209 173

(51) Int. Cl.
*C01B 33/02* (2006.01)
*B81C 1/00* (2006.01)
(Continued)

(52) U.S. Cl.
CPC .......... *C01B 33/02* (2013.01); *B81C 1/00666* (2013.01); *C23C 16/24* (2013.01); *H01L 29/16* (2013.01); *C01P 2002/60* (2013.01); *C01P 2002/90* (2013.01); *C01P 2006/40* (2013.01); *H01L 21/0245* (2013.01); *H01L 21/02439* (2013.01); *H01L 21/02488* (2013.01); *H01L 21/02507* (2013.01); *H01L 21/02513* (2013.01); *H01L 21/02532* (2013.01); *H01L 21/02595* (2013.01)

(58) Field of Classification Search
CPC ..... C01B 33/02; C23C 16/24; H01L 21/0245; H01L 21/02439; H01L 21/02595; H01L 21/02532; C01P 2002/60
See application file for complete search history.

(56) References Cited

U.S. PATENT DOCUMENTS 5,970,369 A * 10/1999 Hara ............... H01L 21/2026
438/488
6,162,716 A * 12/2000 Yu .................. H01L 21/28035
257/E21.197
(Continued)

FOREIGN PATENT DOCUMENTS

EP    0663692 A2    7/1995

*Primary Examiner* — Julia Slutsker
(74) *Attorney, Agent, or Firm* — Norton Rose Fulbright US LLP; Gerard Messina

(57) ABSTRACT

A polycrystalline material having low mechanical strain is provided. The polycrystalline material includes one or multiple layers of a first type and one or multiple layers of a second type. The layers of the first type and the layers of the second type each include at least one polycrystalline material component. The layers of the first type have a smaller average crystal grain size than the layers of the second type, a layer of the first type and a layer of the second type being situated, at least in part, one above the other in an alternating sequence, and it being the case for the transition between the layers of the first type and the layers of the second type to be abrupt or continuous.

20 Claims, 4 Drawing Sheets

(51) Int. Cl.
*C23C 16/24* (2006.01)
*H01L 29/16* (2006.01)
*H01L 21/02* (2006.01)

(56) References Cited

U.S. PATENT DOCUMENTS

| | | |
|---|---|---|
| 6,221,744 B1 | 4/2001 | Shih et al. |
| 6,670,263 B2 | 12/2003 | Ballantine et al. |
| 2007/0102748 A1 | 5/2007 | Tseng et al. |
| 2007/0262688 A1* | 11/2007 | Aurongzeb ............... H01J 9/28 |
| | | 313/318.01 |
| 2010/0227192 A1* | 9/2010 | Lu ........................ B23K 20/04 |
| | | 428/610 |
| 2018/0308928 A1* | 10/2018 | Cheng ............... H01L 21/02532 |

* cited by examiner

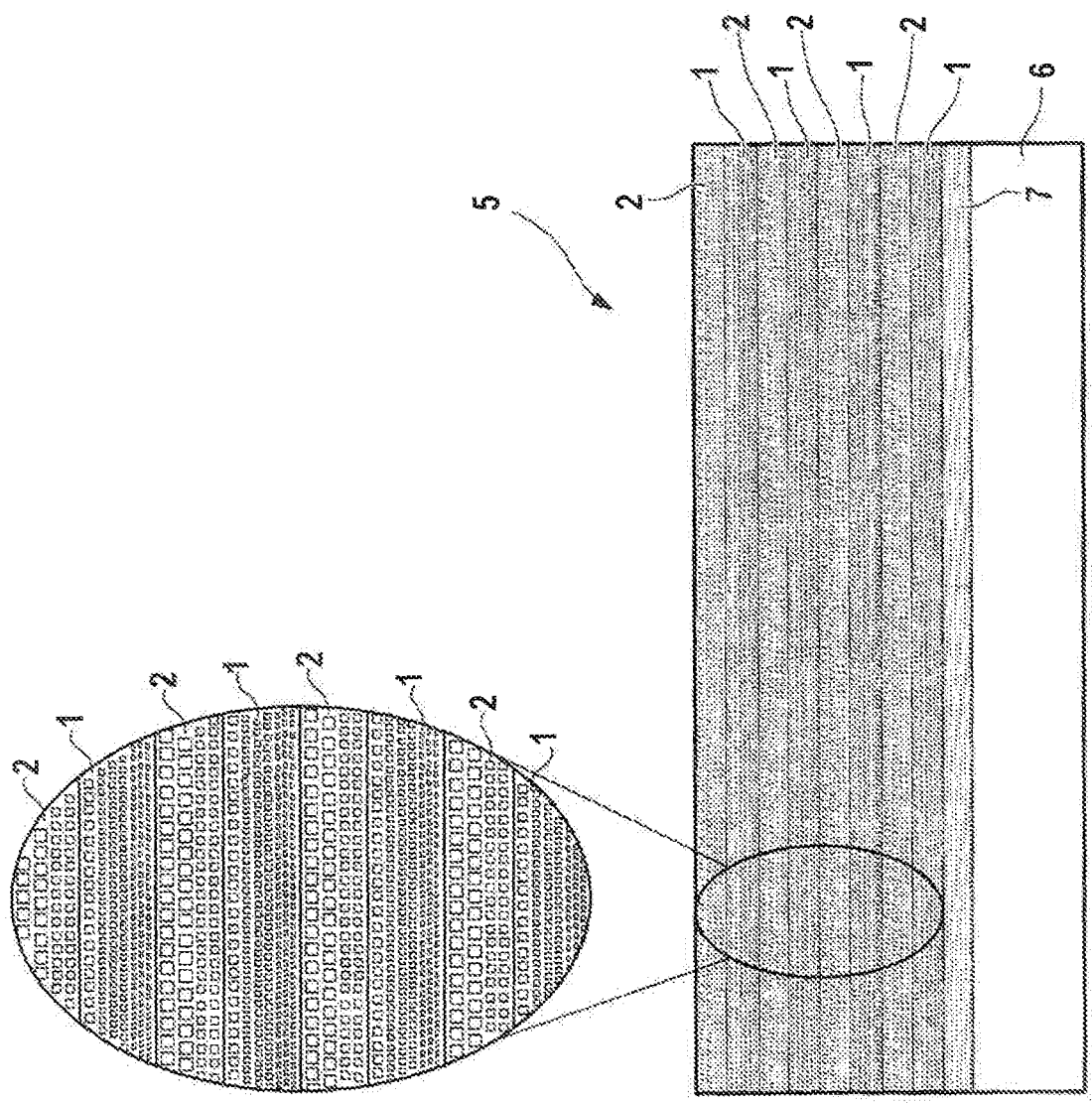

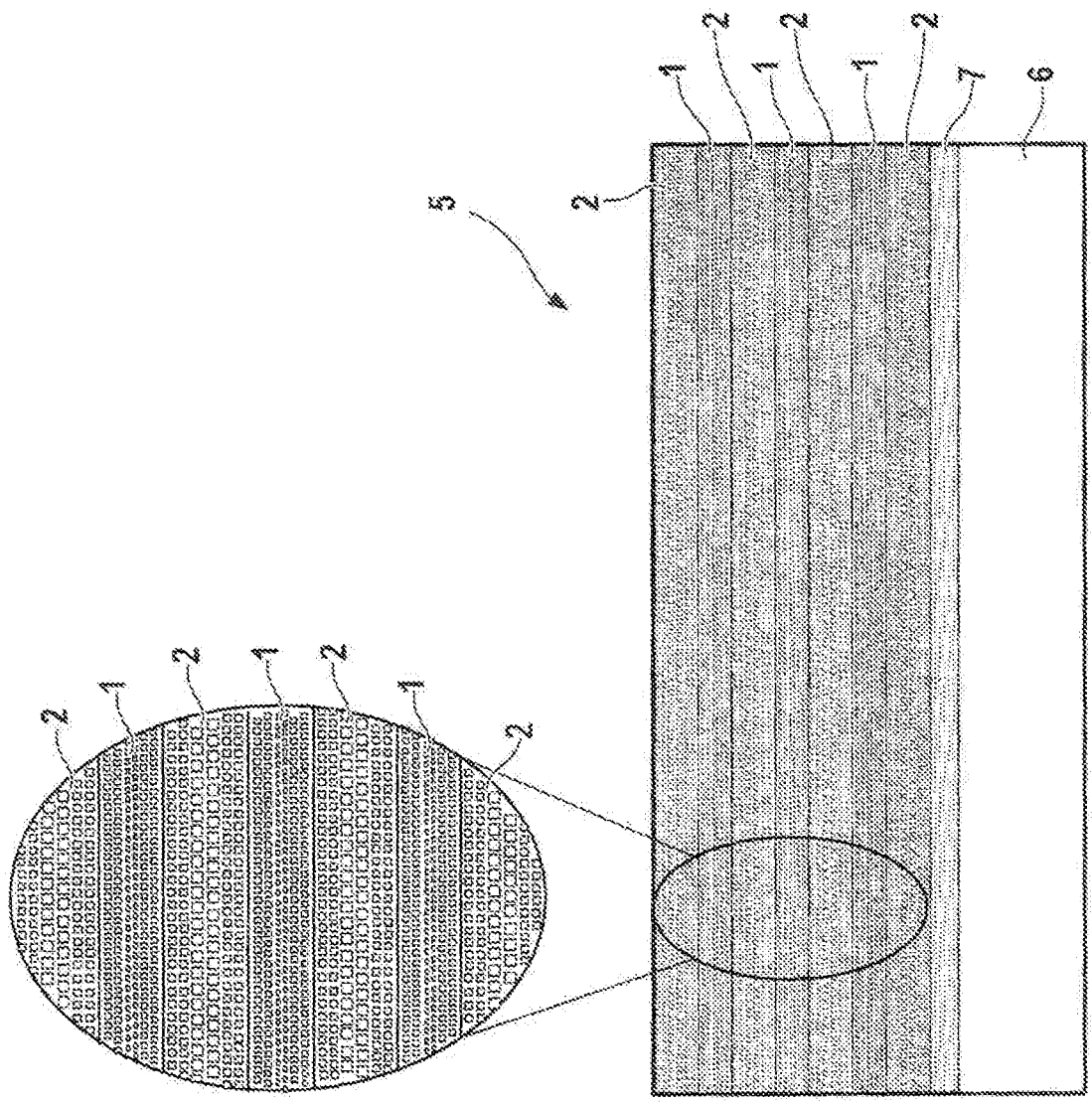

POLYCRYSTALLINE MATERIAL HAVING LOW MECHANICAL STRAIN; METHOD FOR PRODUCING A POLYCRYSTALLINE MATERIAL

FIELD OF THE INVENTION

The present invention is directed to a polycrystalline material. Moreover, the present invention is directed to a method for producing a polycrystalline material.

BACKGROUND INFORMATION

In the growth of polycrystalline layers (in particular for epitaxial growth), crystallites having different preferred growth directions and increasing size are typically produced as a function of the grown layer thickness. Thus, the higher the layer is grown, the larger the crystal grain size of the layer becomes.

One disadvantage with such polycrystalline layers is that as a result, they often have high mechanical strain (i.e., a high layer stress), in particular for an increasing or large layer thickness. Such mechanical strain within the layer is disadvantageous in the subsequent processing of the layers. When such layers are, for example, structured in subsequent process steps, the local (mechanical) stress distribution may sometimes vary greatly. For example, unfavorable preliminary deflections may result with processed components if undercut structures such as freely movable MEMS elements are manufactured from the strained layer.

SUMMARY OF THE INVENTION

An object of the present invention is to provide polycrystalline materials that have low mechanical strain in comparison to the related art.

The polycrystalline material according to the present invention, having low mechanical strain, and the method for producing a polycrystalline material according to the other independent claim have the advantage over the related art that the mechanical strain within the polycrystalline material is comparatively low.

According to the present invention, it is thus possible in particular for the average crystal grain size (or grain size) within the layers of the first type to be smaller than within the layers of the second type, i.e., for the crystallites within the layers of the first type to have a smaller average spatial extension (or spatial dimensions) than crystallites within the layers of the second type. According to the present invention, it is thus possible for the layers of the first type and the layers of the second type to be layers that are made of at least one (or exactly one) polycrystalline material component. According to the present invention, it is thus possible, for example, to provide comparatively thin layers that have comparatively very low mechanical strain, or to provide comparatively thick polycrystalline materials (layers) which, for the thickness of the material, have comparatively low mechanical stress (strain) within the polycrystalline material and the individual layers of the polycrystalline material (layers of the first type and layers of the second type). It is thus advantageously possible according to the present invention to provide and produce polycrystalline materials that may be advantageously used for the (subsequent) production/manufacture of semiconductor components, microelectromechanical systems, or micromechanical systems, etc.

As a result of a layer of the first type and a layer of the second type being situated, at least in part, one above the other in an alternating sequence, it is advantageously possible to provide polycrystalline materials having comparatively low mechanical stress (strain) within the polycrystalline material and the individual layers of the polycrystalline material (layers of the first type and layers of the second type), for example with a comparatively large thickness of the polycrystalline material.

Advantageous embodiments and refinements of the present invention are apparent from the subclaims, and from the description with reference to the drawings.

Due to the fact that the polycrystalline material includes a plurality of layers of the first type and a plurality of layers of the second type, in particular a layer of the first type and a layer of the second type in each case being situated one above the other in an alternating sequence, according to one specific embodiment of the present invention it is advantageously possible for the polycrystalline material to have a large thickness while still keeping the mechanical strain within the polycrystalline material comparatively low.

As a result of the arrangement for depositing and/or for growing having at least one chamber, the depositing and/or the growing of the layers of the first type and of the layers of the second type taking place in the chamber, at least one source gas being used for growing and/or depositing the layers of the first type and/or the layers of the second type, the arrangement for depositing and/or for growing including in particular an epitaxy unit, according to one specific embodiment of the present invention it is advantageously possible for the polycrystalline material to be applied and (epitaxially) grown in a single chamber or in a single unit, as the result of which the production may be carried out easily and in a cost-effective manner. However, according to one specific embodiment of the present invention it is likewise possible for the layers of the first type and the layers of the second type to be grown in different chambers (or sometimes in different units).

Due to the fact that, during the depositing and/or during the growing of the layers of the first type, a different temperature in the chamber prevails than during the depositing and/or during the growing of the layers of the second type, according to one specific embodiment of the present invention it is advantageously possible for the crystal grain size (grain size) of the crystallites of the layers of the first type to be smaller than the crystal grain size (grain size) of the crystallites of the layers of the second type. Likewise, it is thus advantageously possible to set the crystal grain size of the layers of the first type and of the layers of the second type in a comparatively precise manner by fixing/setting the temperature during the growing of the layers of the first type and of the layers of the second type.

According to one specific embodiment of the present invention, it may be provided that the average crystal grain sizes are different in different layers of the first type. It is possible, for example, for a layer of the first type and the second layer of the first type (or some or all of the plurality of layers of the first type) to have a different crystal grain size. It is likewise possible for the average crystal grain sizes to be different in different layers of the second type. It is possible, for example, for the one layer of the second type and the second layer of the second type (or some or all of the plurality of layers of the second type) to have a different crystal grain size.

According to one specific embodiment of the present invention, it may be provided that the layers of the first type have an at least approximately equal average crystal grain size.

According to one specific embodiment of the present invention, it may be provided that the layers of the second type have an at least approximately equal average crystal grain size.

According to one specific embodiment of the present invention, it may be provided that the plurality of layers of the first type includes three, which may be four, or which may be five or more, layers of the first type.

According to one specific embodiment of the present invention, it may be provided that the plurality of layers of the second type includes three, which may be four, or which may be five or more, layers of the second type.

In another specific embodiment of the present invention, it may be provided that at least one layer (or also a plurality of layers) of a third type is situated between adjacent layers of the first type and of the second type, which are situated, at least in part, one above the other. The layers of the third type may, for example, have a further (average) crystal grain size that is smaller than the average crystal grain size of the layers of the second type, but larger than the average crystal grain size of the first type. It is likewise possible for the layers of the third type to have, for example, a different material composition than the layers of the first type and of the second type.

BRIEF DESCRIPTION OF THE DRAWINGS

FIG. 4 schematically shows a cross-sectional illustration of a polycrystalline material according to a fourth specific embodiment of the present invention.

FIG. 5 schematically shows a cross-sectional illustration of a polycrystalline material according to a fifth specific embodiment of the present invention.

DETAILED DESCRIPTION

Figure 1:
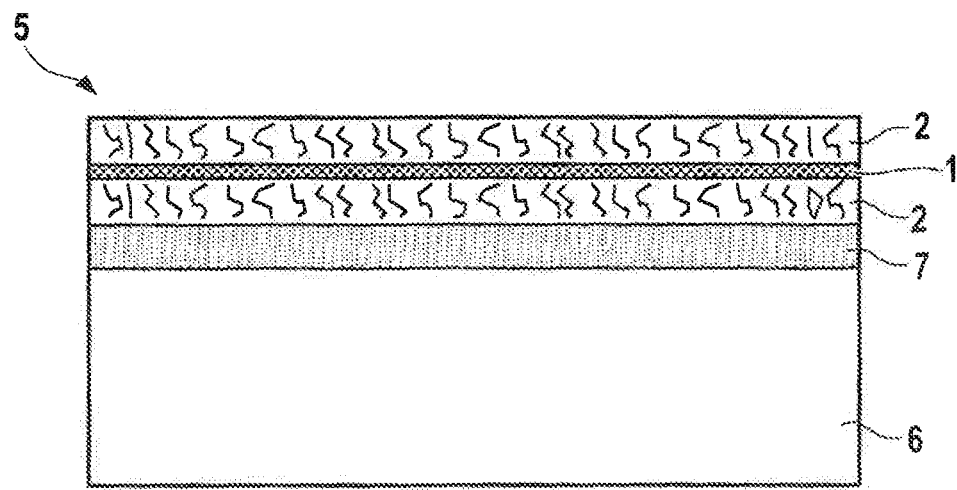
FIG. 1 schematically shows a cross-sectional illustration of a polycrystalline material according to a first specific embodiment of the present invention.

FIG. 1 shows a polycrystalline material 5 having low mechanical strain according to a first specific embodiment of the present invention. Polycrystalline material 5 is situated on a separating layer 7. Separating layer 7 may include or be made of silicon oxides, for example. It is likewise possible for separating layer 7 to include other material components, for example nitrides, LNO, etc., or to be made of at least one of these components. It is likewise possible for separating layer 7 to be made up of a combination of such material components.

Polycrystalline material 5 includes a layer of a first type 1 and a layer of a second type 2, as well as a second layer of second type 2. The arrangement of the layers of polycrystalline material 5 is situated on separating layer 7, separating layer 7 being formed on a top side of substrate 6. A layer of first type 1 is situated above the layer of second type 2 (and in the illustrated specific embodiment is in direct contact with the layer of second type 2). A second layer of second type 2 is situated above the layer of first type 1 (and in the illustrated specific embodiment is in direct contact with the layer of first type 1). The layers of first type 1 have a smaller average crystal grain size (grain size) than the layers of second type 2.

According to further specific embodiments of the polycrystalline material according to the present invention, it is likewise possible for a layer (or a plurality of layers) of a third type (which, for example, contains a different material component than the layers of first type 1 and of second type 2, or contains the same material components as the layers of first type 1 and of second type 2, and has an average crystal grain size that is smaller than the average crystal grain size of the layers of second type 2, but larger than the average crystal grain size of first type 1) to be formed between a layer of first type 1 and a layer of second type 2.

According to further specific embodiments of the polycrystalline material according to the present invention, it is likewise possible for a (gas-filled) space to be formed, at least in part, between a layer of first type 1 and a layer of second type 2.

Figure 2:
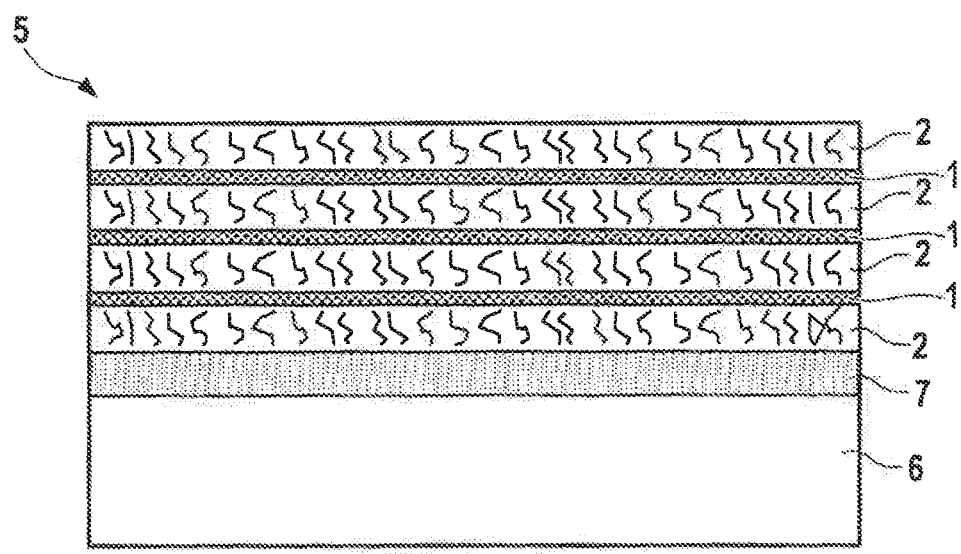
FIG. 2 schematically shows a cross-sectional illustration of a polycrystalline material according to a second specific embodiment of the present invention.

FIG. 2 shows a polycrystalline material 5 having low mechanical strain according to a second specific embodiment of the present invention. Polycrystalline material 5 includes three layers of a first type 1 and four layers of a second type 2. The arrangement of the layers of polycrystalline material 5 is situated on separating layer 7, separating layer 7 being formed on a top side of substrate 6. The layers of first type 1 and the layers of second type 2 are situated one above the other and in direct contact with one another in an alternating sequence. The layers of first type 1 have a smaller average crystal grain size (grain size) than the layers of second type 2.

Figure 3:
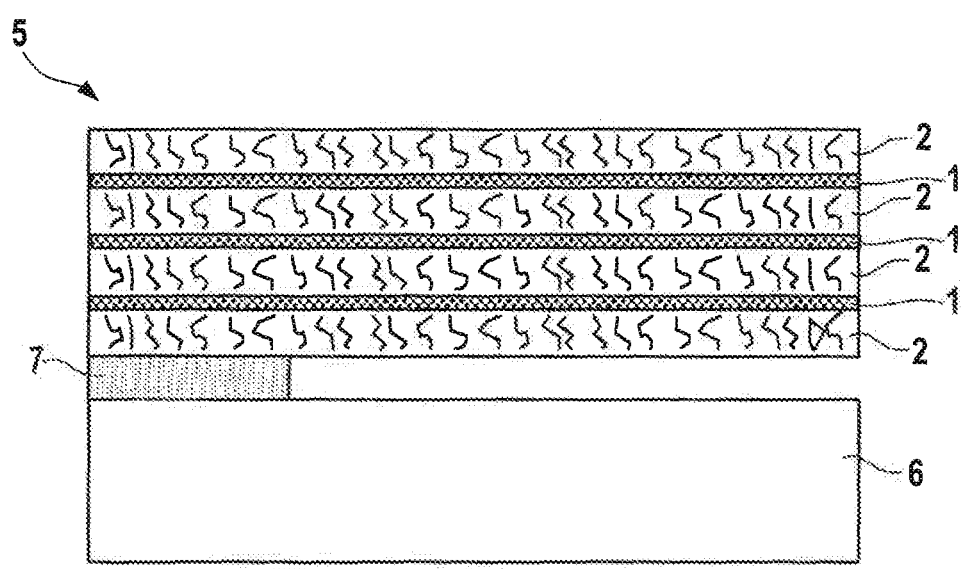
FIG. 3 schematically shows a cross-sectional illustration of a polycrystalline material according to a third specific embodiment of the present invention.

FIG. 3 shows a polycrystalline material 5 having low mechanical strain according to a third specific embodiment of the present invention. Polycrystalline material 5 includes three layers of a first type 1 and four layers of a second type 2. The layers of first type 1 and the layers of second type 2 are situated one above the other and in direct contact with one another in an alternating sequence. The layers of first type 1 have a smaller average crystal grain size (grain size) than the layers of second type 2. Polycrystalline material 5 is thus situated on a separating layer 7 only in partial areas. In other areas, separating layer 7 has been removed below polycrystalline material 5. For some uses of polycrystalline material 5 (for microelectromechanical systems, for example), separating layer 7 is subsequently removed, so that polycrystalline material 5 (at least in parts) is not situated on a separating layer 7. This is advantageous, for example, when polycrystalline material 5, for example in the areas in which separating layer 7 has been removed below polycrystalline material 5, is used for freely movable structures (within microelectromechanical systems).

FIG. 4 shows a polycrystalline material 5 having low mechanical strain according to a fourth specific embodiment of the present invention. Polycrystalline material 5 includes four layers of a first type 1 and four layers of a second type 2. The layers of first type 1 and the layers of second type 2 are situated one above the other and in direct contact with one another in an alternating sequence. The arrangement of the layers of polycrystalline material 5 is situated on separating layer 7, separating layer 7 being formed on a top side of substrate 6. Within an individual layer of first type 1, the crystal grain size increases in a preferred direction. In FIG. 4, the preferred direction points vertically upwards, away from substrate 6. Within an individual layer of second type 2, the crystal grain size likewise increases in the same preferred direction. Despite the increasing crystal grain size in the preferred direction in each case within the layers of first type 1 and the layers of second type 2, the layers of first type 1 in each case always have a smaller average crystal grain size than the layers of second type 2. According to such a fourth specific embodiment, it is possible, for example, for the crystal grain size to continuously increase (i.e., for a continuous progression of the crystal grain size to be provided) from a layer of first type 1 to an adjacent layer of second type 2. In FIG. 4, for example the lowermost layer of first type 1 and the lowermost layer of second type 2 thus continuously merge into one another.

FIG. 5 shows a polycrystalline material 5 having low mechanical strain according to a fifth specific embodiment of the present invention. Polycrystalline material 5 includes three layers of a first type 1 and four layers of a second type. The layers of first type 1 and the layers of second type 2 are situated one above the other and in direct contact with one another in an alternating sequence. The arrangement of the layers of polycrystalline material 5 is situated on separating layer 7, separating layer 7 being formed on a top side of substrate 6. Within an individual layer of first type 1, the crystal grain size initially decreases in a preferred direction and then increases. In FIG. 5, the preferred direction points vertically upwards, away from substrate 6. Within an individual layer of second type 2, the crystal grain size initially increases in the same preferred direction and then decreases. Despite the increasing crystal grain size in the preferred direction in each case within the layers of first type 1 and the layers of second type 2, the layers of first type 1 in each case always have a smaller average crystal grain size than the layers of second type 2. According to this fifth specific embodiment, it is possible for the crystal grain size to continuously progress between (all) adjacent layers of first type 1 and of second type 2. In this way, for example a polycrystalline material may be produced which has a continuous progression of the crystal grain size in a preferred direction (for example, perpendicular to the surface area of the layers) over its entire extent.

THE LIST OF REFERENCE NUMERALS IS AS FOLLOWS 1 first type
2 second type
5 polycrystalline material
6 substrate
7 separating layer

What is claimed is:

1. A polycrystalline material having low mechanical strain, comprising:
   one or more layers of a first type; and
   one or more layers of a second type;
   wherein:
      each of the one or more layers of the first type and each of the one or more layers of the second type includes at least one polycrystalline material component;
      an average of crystal grain sizes of each of the one or more layers of the first type is smaller than an average of crystal grain sizes of each of the one or more layers of the second type;
      the one or more layers of the first type and the one or more layers of the second type are situated, at least in part, one above the other in an alternating sequence;
      in each respective layer of at least one of the one or more layers of the first type, the crystal grain sizes of the respective layer change between a first end of the respective layer and a second end of the respective layer so that an average of respective crystal grain sizes of respective crystal grains at the first end of the respective layer is different than an average of respective crystal grain sizes of respective crystal grains at the second end of the respective layer; and
      in each respective layer of at least one of the one or more layers of the second type, the crystal grain sizes of the respective layer change between a first end of the respective layer and a second end of the respective layer so that an average of respective crystal grain sizes of respective crystal grains at the first end of the respective layer is different than an average of respective crystal grain sizes of respective crystal grains at the second end of the respective layer.

2. The polycrystalline material of claim 1, wherein adjacent layers of the first type and of the second type are in each case formed, at least in part, in direct contact with one another.

3. The polycrystalline material of claim 1, wherein the crystal grain sizes abruptly change at a boundary between at least one layer of the first type and a layer of the second type adjacent to the respective layer of the first type.

4. The polycrystalline material of claim 1, wherein the at least one polycrystalline material component includes polycrystalline silicon.

5. The polycrystalline material of claim 1, wherein the polycrystalline material is situated on a substrate.

6. The polycrystalline material of claim 1, wherein the polycrystalline material includes a plurality of layers of the first type and a plurality of layers of the second type, a layer of the first type and a layer of the second type being situated in each case one above the other in an alternating sequence.

7. The polycrystalline material of claim 1, wherein the polycrystalline material is situated on a substrate.

8. The polycrystalline material of claim 1, wherein the polycrystalline material is situated on a separating layer of a substrate.

9. The polycrystalline material of claim 8, wherein the substrate is a wafer or a chip.

10. The polycrystalline material of claim 7, wherein the substrate is a wafer or a chip.

11. The polycrystalline material of claim 1, wherein:
    in each of at least one of the one or more layers of the first type, the crystal grain sizes of the respective layer gradually increases from the first end of the respective layer to the second end of the respective layer; and
    in each of at least one of the one or more layers of the second type, the crystal grain sizes of the respective layer gradually increases from the first end of the respective layer to the second end of the respective layer.

12. The polycrystalline material of claim 11, wherein, for the each of at least one of the one or more layers of the first type, at least one of:
    the first end of the respective layer is immediately adjacent to the second end of a respective one of the each of at least one of the one or more layers of the second type; and
    the second end of the respective layer is immediately adjacent to the first end of a respective one of the each of at least one of the one or more layers of the second type.

13. The polycrystalline material of claim 11, wherein, for all of the layers, the respective first ends are all respective bottom sides of the respective layers and the respective second ends are all respective top sides of the respective layers or the respective first ends are all respective top sides of the respective layers and the respective second ends are all respective bottom sides of the respective layers.

14. The polycrystalline material of claim 1, wherein:
in each of at least one of the one or more layers of the first type, the crystal grain sizes of the respective layer decreases from exterior edges of the respective layer to a center of the respective layer; and
in each of at least one of the one or more layers of the second type, the crystal grain sizes of the respective layer increases from exterior edges of the respective layer to a center of the respective layer.

15. The polycrystalline material of claim 14, wherein, for the each of at least one of the one or more layers of the first type, at least one of:
the first end of the respective layer is immediately adjacent to the second end of a respective one of the each of at least one of the one or more layers of the second type; and
the second end of the respective layer is immediately adjacent to the first end of a respective one of the each of at least one of the one or more layers of the second type.

16. The polycrystalline material of claim 1, wherein, for each of the layers of the first type, the crystal grain sizes abruptly change at each boundary between the respective layer of the first type and a respective one of the layers of the second type that is adjacent to the respective layer of the first type.

17. The polycrystalline material of claim 1, wherein, for each of the respective layers of the at least one of the one or more layers of the first type and for each of the respective layers of the at least one of the one or more layers of the second type, the change of the crystal grain sizes of the respective layer is gradual.

18. The polycrystalline material of claim 1, wherein, for each of the respective layers of the at least one of the one or more layers of the first type and for each of the respective layers of the at least one of the one or more layers of the second type, the change of the crystal grain sizes of the respective layer occurs gradually in a stacking direction of the layers.

19. The polycrystalline material of claim 18, wherein, at respective boundaries of respective pairs of adjoining ones of the layers, the grain sizes of the respective pair of adjoining layers abruptly change between adjacent edges of the respective pair of adjoining layers.

20. A component comprising:
a substrate;
a separating layer; and
a polycrystalline layer stack;
wherein:
the separating layer is arranged over a first portion of the substrate and below a first portion of the polycrystalline layer stack;
a second portion of the polycrystalline layer stack hangs over a second portion of the substrate, with a void between the second portion of the polycrystalline layer stack and the second portion of the substrate;
the polycrystalline layer stack includes one or more layers of a first type and one or more layers of a second type;
each of the one or more layers of the first type and each of the one or more layers of the second type includes at least one polycrystalline material component;
an average of crystal grain sizes of each of the one or more layers of the first type is smaller than an average of crystal grain sizes of each of the one or more layers of the second type;
the one or more layers of the first type and the one or more layers of the second type are situated, at least in part, one above the other in an alternating sequence;
in each respective layer of at least one of the one or more layers of the first type, the crystal grain sizes of the respective layer changes between a first end of the respective layer and a second end of the respective layer; and
in each respective layer of at least one of the one or more layers of the second type, the crystal grain sizes of the respective layer changes between a first end of the respective layer and a second end of the respective layer.

* * * * *